United States Patent [19]

Honda et al.

[11] Patent Number: 5,780,406

[45] Date of Patent: Jul. 14, 1998

[54] NON-CORROSIVE CLEANING COMPOSITION FOR REMOVING PLASMA ETCHING RESIDUES

[76] Inventors: Kenji Honda, 8 Plymouth Dr., Barrington, R.I. 02806; Eugene F. Rothgery, 28 Bailey Dr., North Branford, Conn. 06471

[21] Appl. No.: 709,053

[22] Filed: Sep. 6, 1996

[51] Int. Cl.$^6$ .............................. C11D 7/26; C11D 7/32; C11D 7/60; B08B 3/08

[52] U.S. Cl. .................. 510/175; 510/176; 510/437; 134/2; 134/3; 134/1.3; 134/38; 134/40; 134/41; 134/42

[58] Field of Search .......................... 134/2, 38, 40, 134/42, 1.3, 3, 41; 510/175, 176, 435

[56] References Cited

U.S. PATENT DOCUMENTS

| | | | |
|---|---|---|---|
| 3,582,401 | 6/1971 | Berilla et al. | 134/3 |
| 3,962,108 | 6/1976 | Perruccio | 252/142 |
| 3,962,497 | 6/1976 | Doty et al. | 427/306 |
| 3,975,215 | 8/1976 | Rodzewich | 148/6.17 |
| 4,015,986 | 4/1977 | Paal et al. | 96/36 |
| 4,026,831 | 5/1977 | Moriya et al. | 260/2.1 R |
| 4,169,068 | 9/1979 | Harita et al. | 252/143 |
| 4,239,661 | 12/1980 | Muraoka et al. | 252/541 |
| 4,267,260 | 5/1981 | Miura et al. | 430/302 |
| 4,304,681 | 12/1981 | Martin et al. | 252/143 |
| 4,395,348 | 7/1983 | Lee | 252/143 |
| 4,395,479 | 7/1983 | Ward et al. | 430/258 |
| 4,401,747 | 8/1983 | Ward, Jr. et al. | 430/258 |
| 4,401,748 | 8/1983 | Ward, Jr. et al. | 430/258 |
| 4,403,029 | 9/1983 | Ward, Jr. et al. | 430/258 |
| 4,428,871 | 1/1984 | Ward et al. | 252/542 |
| 4,509,989 | 4/1985 | Sumansky | 134/22.12 |
| 4,612,049 | 9/1986 | Berner et al. | 106/14.13 |
| 4,617,251 | 10/1986 | Sizensky | 430/256 |
| 4,659,512 | 4/1987 | Macedo et al. | 252/629 |
| 4,680,133 | 7/1987 | Ward | 252/153 |
| 4,770,713 | 9/1988 | Ward | 134/38 |
| 4,775,449 | 10/1988 | Dumas et al. | 204/30 |
| 4,778,669 | 10/1988 | Fuchs et al. | 423/387 |
| 4,786,578 | 11/1988 | Neisius et al. | 430/256 |
| 4,791,043 | 12/1988 | Thomas et al. | 430/256 |
| 4,824,762 | 4/1989 | Kobayashi et al. | 430/258 |
| 4,824,763 | 4/1989 | Lee | 430/258 |
| 4,830,772 | 5/1989 | Van De Mark | 252/170 |
| 4,834,912 | 5/1989 | Hodgens et al. | 252/545 |
| 4,844,832 | 7/1989 | Kobayashi et al. | 252/143 |
| 4,904,571 | 2/1990 | Miyashita et al. | 430/331 |
| 4,944,893 | 7/1990 | Tanaka et al. | 252/171 |
| 4,971,715 | 11/1990 | Armant et al. | 252/143 |
| 4,992,108 | 2/1991 | Ward et al. | 134/38 |
| 5,091,103 | 2/1992 | Dean et al. | 252/162 |

(List continued on next page.)

FOREIGN PATENT DOCUMENTS

| | | |
|---|---|---|
| 414097 | 2/1991 | European Pat. Off. . |
| 485161 | 5/1992 | European Pat. Off. . |
| 511163 | 10/1992 | European Pat. Off. . |
| 0 647 884 A1 | 4/1995 | European Pat. Off. . |
| 3821231 | 1/1989 | Germany . |
| 3828513 | 3/1990 | Germany . |
| 49024123 | 6/1974 | Japan . |
| 56-115368 | 9/1981 | Japan . |
| 63-050838 | 3/1988 | Japan . |
| 63-208043 | 8/1988 | Japan . |
| 1-042653 | 2/1989 | Japan . |
| 1-081949 | 3/1989 | Japan . |
| 1-081950 | 3/1989 | Japan . |
| 89-013217 | 3/1989 | Japan . |
| 1-088548 | 4/1989 | Japan . |
| 1-114846 | 5/1989 | Japan . |
| 1-133049 | 5/1989 | Japan . |
| 2-048668 | 2/1990 | Japan . |
| 2-131239 | 5/1990 | Japan . |
| 2-253265 | 10/1990 | Japan . |
| 4-124668 | 4/1992 | Japan . |
| 5-045894 | 2/1993 | Japan . |
| 93-024498 | 4/1993 | Japan . |
| 4-350660 | 11/1993 | Japan . |
| 7-028254 | 1/1995 | Japan . |
| 7-244386 | 9/1995 | Japan . |
| 7-271056 | 10/1995 | Japan . |
| WO 8805813 | 8/1988 | WIPO . |
| 94/08276 | 4/1994 | WIPO . |

OTHER PUBLICATIONS

Lee, Wai Mun, Proc.–Electrochem. Soc., 93–25 (Interconnects, Contact Metallization, and Multilevel Metallization/Reliability for Semiconductor Devices, Interconnects, and Thin Insulator Materials), 326–340, month unknown, 1993.

Yeh, Wen–Kuan, et al., "An Efficient Preclean of Aluminized Silicon Substrate for Chemical Vapor Deposition of Submicron Tungsten Plugs", J. Electrochem. Soc., 142(10), 3584–3588, Oct. 1995

American Chemical Society, Registry nos., 58888–47–4, 13465–08–2, 10039–54–0, 5470–11–1, 4682–08–0, 20712–83–8, 185828–68–6, 95154–01–1, 112–24–3, month not known, 1997.

"Development Of Advanced Corrosion Free Organic Strippers For ULSI Processing" by A.L.P. Rotondaro, K. Honda, T. Maw, D. Perry, M. Lux, M.M. Heyns, C. Claeys and I. Dataktchiev, appearing at Fourth International Symposium On Cleaning Technology In Semiconductor Device Manufacturing, Oct. 1995, Chicago, Illinois.

"Investigation Of Advanced Organic Strippers For ULSI Processing" by A.L.P. Rotondaro, R.M. Gluck, M. Meuris, M.M. Heyns C. Claeys, K. Honda and I. Daraktchiev for presentation at INTERFFACE 94, Nov. 1994, San Diego, CA.

"Thin Film Pitting: Is NMP the Culprit?", by Dr. Franco T. Lee, Dr. David R. Wanlass and B. Walsh, appearing in Semiconductor International, Jun. 1994.

Primary Examiner—Douglas J. McGinty
Attorney, Agent, or Firm—Ohlandt, Greeley, Ruggiero & Perle

[57] ABSTRACT

A non-corrosive cleaning composition for removing plasma etching residues having a pH from 2 to 6 and comprising: (A) water; (B) at least one selected hydroxylammonium compound; and (C) at least one basic compound; and optionally (D) a chelating stabilizer; and optionally (E) a surfactant.

10 Claims, No Drawings

U.S. PATENT DOCUMENTS

| | | | |
|---|---|---|---|
| 5,102,777 | 4/1992 | Lin et al. | 430/331 |
| 5,114,834 | 5/1992 | Nachshon | 430/329 |
| 5,132,038 | 7/1992 | Kukanskis et al. | 252/139 |
| 5,139,607 | 8/1992 | Ward et al. | 156/655 |
| 5,145,717 | 9/1992 | Drury | 427/96 |
| 5,174,816 | 12/1992 | Aoyama et al. | 106/203 |
| 5,185,235 | 2/1993 | Sato et al. | 430/331 |
| 5,209,858 | 5/1993 | Heinsohn et al. | 252/1 |
| 5,234,506 | 8/1993 | Winston et al. | 134/40 |
| 5,279,771 | 1/1994 | Lee | 252/548 |
| 5,296,041 | 3/1994 | Vinci et al. | 134/40 |
| 5,308,745 | 5/1994 | Schwartzkopf | 430/329 |
| 5,312,562 | 5/1994 | Vinci et al. | 252/174.14 |
| 5,318,640 | 6/1994 | Ishii et al. | 148/264 |
| 5,334,332 | 8/1994 | Lee | 252/548 |
| 5,381,807 | 1/1995 | Lee . | |
| 5,417,802 | 5/1995 | Osbeng | 216/13 |
| 5,419,779 | 5/1995 | Ward | 134/38 |
| 5,447,575 | 9/1995 | Crump et al. | 134/42 |
| 5,472,830 | 12/1995 | Honda | 430/331 |
| 5,480,585 | 1/1996 | Shiotsu et al. | 252/544 |
| 5,482,566 | 1/1996 | Lee | 134/42 |
| 5,484,518 | 1/1996 | Goldberg | 205/166 |
| 5,496,491 | 3/1996 | Ward et al. | 252/153 |
| 5,507,978 | 4/1996 | Honda | 252/544 |
| 5,545,353 | 8/1996 | Honda et al. | 510/176 |
| 5,612,304 | 3/1997 | Honda et al. | 510/176 |
| 5,648,324 | 7/1997 | Honda et al. | 510/176 |
| 5,698,503 | 12/1997 | Ward et al. | 510/176 |

NON-CORROSIVE CLEANING COMPOSITION FOR REMOVING PLASMA ETCHING RESIDUES

BACKGROUND OF THE INVENTION

1. Field of The Invention

This invention relates to a cleaning composition for use in microelectronics manufacturing, and more particularly to a non-corrosive cleaning composition that removes plasma etching by-products formed on wafer substrates after plasma etching of metal layers or metal oxides deposited on substrates.

2. Brief Description of Art

In the manufacture of microcircuits, positive photoresists are used as an intermediate mask to transfer an original mask pattern of a reticle onto wafer substrates by means of a series of photolithography and plasma etching steps. One of the final steps in the microcircuit manufacturing is removal of the patterned photoresist films from the substrates. In general, this step is affected by two methods. One method involves a wet stripping step in which the photoresist-covered substrate is brought into contact with a photoresist stripper solution that consists primarily of an organic solvent and an amine. However, stripper solutions cannot remove photoresist films completely in all cases, especially if they are exposed to UV radiation and plasma treatments during fabrication. Some photoresist films become highly crosslinked by such treatments and are more difficult to dissolve in the stripper solution. In addition, the chemicals used in these conventional wet stripping methods are sometimes ineffective in removing inorganic residual materials formed by an earlier step of plasma etching of metal or metal oxide layers with halogen-containing gases.

An alternative method of removing a photoresist film involves exposing a photoresist-coated wafer to an oxygen plasma to burn the resist film from the substrate surface, in a process known as oxygen plasma ashing. Recently, oxygen plasma ashing has become more popular in the microcircuit manufacturing process because it is carried out in a vacuum chamber and, hence, is expected to be less susceptible to airborne particulate or metallic contamination. However, oxygen plasma ashing is also not fully effective in removing plasma etching residues noted above.

Instead, removal of these plasma etching residues must be accomplished by exposing them to certain alkaline solutions. Several commercial products are now available to clean the plasma etching residues left by plasma etching followed by oxygen ashing. For example, EKC 265, available from EKC Technology, Inc., is a plasma etching cleaning solution composed of water, alkanolamine, catechol and hydroxylamine. Such a composition is disclosed in U.S. Pat. No. 5,279,771 by Wai M. Lee. ACT 935, available from Ashland Chemical, is another plasma etching cleaning solution composed of water, alkanolamine and catechol. In both cases, catechol is used as a corrosion inhibitor. A post-strip rinse, R-10, available from Mitsubishi Gas Chemical, is also composed of water, alkanolamine and a sugar alcohol, wherein the sugar alcohol acts as a corrosion inhibitor.

In these commercial products, a combination of water and alkanolamine will not only dissolve the plasma etching residues, but may also attack metallic layers patternwise deposited on the substrate. The addition of a corrosion inhibitor is thus necessary in those products to prevent the unwanted attack on the metallic layers in the substrate. However, since these products have a pH above 11, they may attack certain corrosion-sensitive metal layers in wafer substrates regardless of the presence of a corrosion inhibitor. Particularly, metal layers such as aluminum or its alloys (e.g., Al—Cu—Si), titanium nitride, titanium tungsten and the like are especially corrosion-sensitive. Therefore, the addition of a suitable corrosion inhibitor is essential to prevent corrosion of the substrate metal layers without inhibiting the plasma etching residue removal. It is, however, difficult to balance the two desired results: (1) effective plasma etching residue removal and (2) corrosion inhibition, because chemical compositions of the plasma etching residues are in general similar to those of the metal layers in the substrate. Thus, the alkanolamine included in the prior art cleaning compositions may attack both the plasma etching residue and the substrate metal layers. Moreover, if a post-cleaner rinse such as isopropyl alcohol is not used, the corrosion may be very severe. In addition, it should be noted that some types of the corrosion inhibitors tend to retard plasma etching residue removal. Accordingly, to date there has not been developed a perfect cleaning product for quickly removing the plasma etching residues without causing metal layer corrosion. There has always been a tradeoff between speed of plasma etching residue removal and substrate metal layer corrosion inhibition.

Several other patents in the photoresist stripper/cleaner application field exist as follows, although none of them disclose the use of the compositions of the present invention.

Japanese Patent Application No. 7-028254, assigned to Kanto Kagaku, discloses a non-corrosive resist removal liquid comprising a sugar alcohol, an alcohol amine, water, and a quaternary ammonium hydroxide.

PCT Published Patent Application No. WO 88-05813 teaches a positive or negative photoresist stripper containing butyrolactone or caprolactone, quaternary ammonium hydroxide compound, and optionally a nonionic surfactant.

U.S. Pat. No. 4,239,661 to Muraoka et al. discloses a surface-treating agent comprising an aqueous solution of 0.01% to 20% trialkyl(hydroxyalkyl) ammonium hydroxide. This agent is useful in removing organic and inorganic contaminants deposited on the surface of intermediate semiconductor products.

U.S. Pat. No. 4,904,571 to Miyashita et al. teaches printed circuit board photoresist stripper composition containing a solvent (e.g., water, alcohols, ethers, ketones, and the like), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing: (A) N-alkyl-2-pyrrolidone;
 (B) 1,2-propanediol; and (C) tetraalkylammonium hydroxide.

U.S. Pat. No. 5,139,607 to Ward et al. teaches positive and negative photoresist stripping composition containing: (A) tetrahydrofurfuryl alcohol; (B) a polyhydric alcohol (e.g., ethylene glycol or propylene glycol); (C) the reaction product of furfuryl alcohol and an alkylene oxide; (D) a water-soluble Bronstead base type hydroxide compound (e.g., alkali metal hydroxide, ammonium hydroxide and tetramethyl ammonium hydroxide); and (E) water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, comprising an aqueous solution containing 0.01 to 15% by weight of a quaternary ammonium hydroxide, such as trimethyl(2-hydroxyethyl)ammonium hydroxide, and 0.1 to 20% by weight of sugar or sugar alcohol, such as xylitol, mannose, glucose and the like.

BRIEF SUMMARY OF THE INVENTION

The present invention is directed to a non-corrosive cleaning composition useful for removing plasma etching residues having a pH from about 2 to about 6 and comprising:

(A) water;

(B) at least one hydroxylammonium compound selected from the group consisting of hydroxylammonium salts of the formula (I):

$$n(NR_1R_2R_3OH)^+(X^{-n}) \qquad (I)$$

wherein $R_1$, $R_2$ and $R_3$ are individually selected from hydrogen, lower alkyl groups having 1 to 4 carbon atoms, lower alkoxy groups having 1 to 4 carbon atoms, hydroxyl and hydroxyl-substituted lower alkyl groups having 1 to 4 carbon atoms, with the proviso that at least two of $R_1$, $R_2$ and $R_3$ are either hydrogen, lower alkyl group or lower alkoxy group, and wherein X is an anionic moiety that is soluble in water and compatible with said quaternary ammonium hydroxide radical; and n is the valence of X and is from 1 to 3; and (C) at least one basic compound selected from the group consisting of amines and quaternary ammonium hydroxides.

DETAILED DESCRIPTION OF THE PREFERRED EMBODIMENTS OF THE INVENTION

It has been found that selective plasma etching residue removal with no substrate metal layer attack can be achieved by the combination of (1) adjusting a pH of the cleaning solution and (2) use of selected basic and acidic components. That is, the cleaning composition of the present invention comprises admixture of a basic component and an acidic component so as to set the pH of the solution in an acidic range of about 2 to about 6. The basic component used in this case is selected from amines and quaternary ammonium hydroxides, while the acidic component is selected from hydroxylammonium salts which also contribute to enhance the removal of the plasma etching residues and prevent metal attack. Thus, the cleaning composition of the present invention does not require a corrosion inhibitor. This cleaning composition is quite different from the previous cleaning approaches in this application field.

Hydroxylammonium compounds useful in the composition of the invention include hydroxylammonium salts such as hydroxylammonium nitrate (also referred to as HAN), hydroxylammonium sulfate (also referred to as HAS), hydroxylammonium phosphate, hydroxylammonium chloride, hydroxylammonium oxalate, hydroxylammonium citrate, and the like. Alkyl-substituted derivatives of hydroxylammonium salts are also useful: e.g. hydroxyl diethylammonium salts and the like. Preferably, the hydroxylammonium compound is present in the composition of the invention in the range of about 1% to about 70% by weight.

Amines useful in the composition of the invention include hydroxylamine and other alkanolamines such as monoethanolamine, diethanolamine, triethanolamine, diethyleneglycolamine, N-hydroxylethylpiperazine, and the like.

Quaternary ammonium hydroxides useful in the composition of the invention include tetraalkylammonium hydroxides having alkyl groups of methyl, ethyl, propyl, butyl, hydroxyethyl, benzyl, and the combinations thereof (e.g., such as tetramethylammonium hydroxide (hereinafter referred to as TMAH), tetraethylammonium hydroxide, trimethyl hydroxyethylammonium hydroxide, methyl tri (hydroxyethyl)ammonium hydroxide, tetra(hydroxyethyl) ammonium hydroxide, benzyl trimethylammonium hydroxide, and the like). Additionally, a combination of ammonium hydroxide with one or more quaternary ammonium hydroxides may also be used.

Preferably, the basic compound is present in the composition of the invention in the range of about 0.01% to about 10% by weight, and the balance of the composition is water.

A chelating stabilizer may be optionally included in the composition of the invention to stabilize the hydroxylammonium salts. Suitable chelating stabilizers include triethylenetetramine (hereinafter referred to as TETA); 2.2'-{[methyl-1H-benzotriazol-1-yl)methyl]imino}bisethanol (Tradename is IRGAMET 42), (2-benzothiazolythio) succinic acid (Tradename is IRGACOR 252), tricine, bicine, and other water-soluble chelating compounds. Preferably, the stabilizer is present in the composition of the invention in the range of about 5 ppm to about 50 ppm by weight to a total weight of the cleaning composition of the present invention.

A surfactant may also be optionally included in the composition of the invention so as to enhance the power of the plasma etching residue removal from the substrate. Suitable ones are selected from nonionic types, cationic types and anionic types of surfactants. Preferably, a surfactant is present in the composition of the invention in the range of about 0.1 ppm to about 30 ppm by weight to a total weight of the cleaning composition of the present invention.

The cleaning composition of the present invention can be used either in combination with the oxygen plasma ashing or with a conventional wet photoresist stripping solution. The cleaning composition of this invention is not specifically designed to remove photoresist films from wafer substrates. Rather, the present cleaning composition is designed to remove plasma etching residues after removing photoresists by the dry or wet stripping methods. The cleaning composition of the invention can also be used to replace the organic solvent-based post-strip rinse because it is a non-corrosive and weakly acidic aqueous solution that will not harm the environment. Thus, the cleaning composition may be disposed of in a regular drain system for aqueous chemical wastes.

The following Examples further illustrate the present invention. All parts and percentages are by weight and all temperatures are degrees Celsius, unless explicitly otherwise stated.

Example 1

A cleaning solution was prepared by mixing 13M HAN, 80 wt % of hydroxylammonium nitrate aqueous solution, obtained from Olin Corporation, and OPD 262, 2.39 wt % TMAH aqueous solution, obtained from Olin Corporation, at a blend ratio of 13M HAN/OPD262=70/30 by weight.

The cleaning of metal etch residue from a substrate was made with the above cleaning composition using a multilayered substrate of Photoresist/SiO$_2$/TiN/Al—Si—Cu/Si, that was patterned lithographically, etched in a plasma metal etcher, and followed by oxygen plasma ashing to remove the top layer of photoresist completely.

The thus prepared wafers were immersed in the above-mentioned cleaning solution at 60° C. for 30 minutes without agitation. One of the wafers was then immersed in isopropyl alcohol for 60 seconds and further immersed in deionized water at room temperature with nitrogen bubbling for 5 minutes. The plasma etching residues in both the bond pad and via structures were completely removed and both of the metal layers, Al—Si—Cu and TiN, were not corroded. In particular, this cleaning solution did not show any difference in the performance between with and without the intermediate rinse by isopropyl alcohol.

EXAMPLES 2–4

Examples 2–4 illustrate the cleaning of the same wafer structures as mentioned in Example 1 with different compositions of the cleaning solution as shown in Table 1.

TABLE 1

| Example # | Composition* 13MHAN: OPD262 | Performance** PERC | CIN |
|---|---|---|---|
| 1 | 70:30 | +++ | +++ |
| 2 | 50:50 | +++ | ++ |
| 3 | 30:70 | +++ | + |
| 4 | Diluted 70:30 | ++ | +/− |

Notes:
*Composition by weight ratio; in Example 4, the 70/30 mixture was further diluted with deionized water by a factor of 10:1.
**In performance, PERC denotes the plasma etching residue cleaning and CIN denotes the metal corrosion inhibition. The symbol "+++" means perfect; the symbol "++" means good; the symbol "+" means marginal; and the symbol "+/−" means unsatisfactory.

EXAMPLE 5

A cleaning solution was prepared by dissolving hydroxylammonium sulfate (21.1 grams) as a solid, obtained from Aldrich Chemical, in 69.1 grams of deionized water and adding OPD 262 (9.8 grams) so as to adjust the pH of the cleaning solution to about 4.30.

The method of the test of the plasma-etch residue cleaning and the metal corrosion was the same as described in Example 1; IPA rinse was not applied in this case.

The SEM analysis showed a complete removal of the plasma-etch residue with no corrosion of the metal layers of Al—Si—Cu and TiN.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A cleaning composition useful for removing residues formed during plasma etching and having a pH from 2 to 6 and comprising in effective amounts:

(A) water;
   (B) at least one acidic hydroxylammonium compound selected from the group consisting of hydroxylammonium salts of the formula:

$$n(NR_1R_2R_3OH)^+(X^{-n})$$

wherein $R_1$, $R_2$ and $R_3$ are individually selected from hydrogen, lower alkyl groups having 1 to 4 carbon atoms, lower alkoxy groups having 1 t 4 carbon atoms, hydroxyl and hydroxyl-substituted lower alkyl groups having 1 to 4 carbon atoms, with the proviso that at least two of $R_1$, $R_2$ and $R_3$ are hydrogen, lower alkyl group or lower alkoxy group; and wherein X is an anionic moiety that is soluble in water and compatible with said amines or quaternary ammonium hydroxides; and n is the valence of X and is from 1 to 3; and (C) at least one basic compound selected from amines and quaternary ammonium hydroxides.

2. The cleaning composition of claim 1, wherein said hydroxylammonium compound is selected from the group consisting of hydroxylammonium nitrate, hydroxylammonium sulfate, hydroxylammonium phosphate, hydroxylammonium oxalate, hydroxylammonium citrate, and hydroxylammonium chloride.

3. The cleaning composition of claim 1, wherein the amount of hydroxylammonium compound is from about 1% to about 70% by weight of the cleaning composition.

4. The cleaning composition of claim 1, wherein said amine is selected from the group consisting of hydroxylamine, monoethanolamine, diethanolamine, triethanolamine, diethyleneglycolamine, and N-hydroxyethylpiperazine.

5. The cleaning composition of claim 1, wherein said quaternary ammonium hydroxide is selected from the group consisting of tetramethylammonium hydroxide, tetraethylammonium hydroxide, trimethyl hydroxyethylammonium hydroxide, methyl tri(hydroxyethyl)ammonium hydroxide, tetra(hydroxyethyl)ammonium hydroxide, and benzyl trimethylammonium hydroxide.

6. The cleaning composition of claim 1, wherein the amount of said basic compound is from 0.01% to about 10% by weight of the cleaning composition.

7. The cleaning composition of claim 1, wherein a chelating compound is additionally present and is selected from the group consisting of triethylene-tetramine, 2,2'-|[(methyl-1-H-benzotriazol-1-yl)methyl|imino|bisethanol, and (2-benzothiazolylthio)succinic acid.

8. The cleaning composition of claim 1, wherein a surfactant is additionally present and is selected from a nonionic surfactant.

9. A method of cleaning a semiconductor substrate comprising the step of contacting said substrate with the composition of claim 1.

10. The method of claim 9, wherein said substrate is contacted with said composition after a step of contacting said substrate with an organic solvent-based photoresist stripper solution.

* * * * *